(12) United States Patent
Zhong

(10) Patent No.: US 11,277,945 B2
(45) Date of Patent: Mar. 15, 2022

(54) RACKLESS THERMAL-EFFICIENT MODULAR POWER ELECTRONIC SYSTEM

(71) Applicant: Qingchang Zhong, Willowbrook, IL (US)

(72) Inventor: Qingchang Zhong, Willowbrook, IL (US)

( * ) Notice: Subject to any disclaimer, the term of this patent is extended or adjusted under 35 U.S.C. 154(b) by 0 days.

(21) Appl. No.: 17/112,950

(22) Filed: Dec. 4, 2020

(65) Prior Publication Data

US 2021/0400850 A1  Dec. 23, 2021

(30) Foreign Application Priority Data

Jun. 22, 2020 (GB) ..................................... 2009448

(51) Int. Cl.
*H05K 7/20* (2006.01)
*H02M 7/00* (2006.01)

(52) U.S. Cl.
CPC ........ *H05K 7/20909* (2013.01); *H02M 7/003* (2013.01)

(58) Field of Classification Search
None
See application file for complete search history.

(56) References Cited

U.S. PATENT DOCUMENTS

| | | | |
|---|---|---|---|
| 4,213,532 A | 7/1980 | Eggert et al. | |
| 6,279,648 B1 * | 8/2001 | Diels | F28F 3/02 165/185 |
| 7,272,005 B2 * | 9/2007 | Campbell | F28D 15/00 165/165 |
| 7,365,990 B2 * | 4/2008 | RaghuRam | H01L 23/3672 165/80.3 |
| 8,000,103 B2 * | 8/2011 | Lipp | H05K 7/20818 361/702 |
| 8,056,614 B2 * | 11/2011 | Chen | H01L 23/367 165/80.3 |
| 8,081,471 B2 * | 12/2011 | Abert | H05K 7/1468 361/715 |
| 8,191,614 B2 * | 6/2012 | Chiang | H01L 23/3672 165/80.3 |
| 9,549,482 B2 * | 1/2017 | Podemski | H05K 7/02 |

(Continued)

FOREIGN PATENT DOCUMENTS

DE     102012220280 A1    5/2014

*Primary Examiner* — Courtney L Smith

(57) ABSTRACT

This invention discloses a rackless modular power electronic system that optimizes thermal management, modularity, manufacturability, transportation, and installation. Such a power electronic converter system consists of one or more modular power electronic converters mounted one-on-top-of-another and/or one-next-to-another through mounting units, such as screws, nuts and bolts. Each modular power electronic converter is built with a case with heat-dissipating fins on the exterior surface and with vertical and horizontal mounting mechanisms, such as holes, bolts, nuts and screws, which are aligned vertically and horizontally, respectively, for easy mounting. One or more electric fans can be mounted to the system to enhance heat dissipation. Possible applications include any field that adopts power electronic converters, e.g., in wind power, solar power, storage systems, home appliances, IT equipment, motor drives, electric vehicles, more-electric aircraft, and all-electric ships.

12 Claims, 4 Drawing Sheets

(56) References Cited

U.S. PATENT DOCUMENTS

| | | | |
|---|---|---|---|
| 9,600,039 B2* | 3/2017 | Taguchi | H05K 7/20772 |
| 9,730,355 B2* | 8/2017 | Bailey | H05K 7/1487 |
| 11,129,309 B2* | 9/2021 | Tsunoda | H01L 23/467 |
| 2006/0023423 A1* | 2/2006 | Kuo | F28F 3/02 |
| | | | 361/697 |
| 2008/0302509 A1* | 12/2008 | Chen | F21V 29/74 |
| | | | 165/80.3 |

* cited by examiner

RACKLESS THERMAL-EFFICIENT MODULAR POWER ELECTRONIC SYSTEM

CROSS-REFERENCE TO RELATED APPLICATIONS

This nonprovisional patent application claims the benefit of and priority under 35 U.S. Code 119 (b) to U.K. Patent Application No. GB2009448.8 filed on Jun. 22, 2020, entitled "Rackless Thermal-Efficient Modular Power Electronic System", the contents of which are all hereby incorporated by reference herein in its entirety.

TECHNICAL FIELD

This invention is concerned with a power electronic converter system, focusing on designing, manufacturing, and mounting modular power electronic converters into rackless thermal-efficient modular power electronic systems. This improves the manufacturability, transportation, installation, and operation of power electronic converters. Possible applications include any field that adopts power electronic converters, e.g., in wind power, solar power, storage systems, home appliances, IT equipment, motor drives, electric vehicles, more-electric aircraft, and all-electric ships.

BACKGROUND

Due to the rapid growth of global economy, the demand for electricity is constantly increasing, leading to energy crisis and environmental issues. To deal with such problems, more and more distributed generators, such as wind and solar farms, are being utilized. As a result, power systems are going through a paradigm shift from the domination of a small number of large-scale power plants equipped with electric machines to the domination of a large number of smaller distributed generators interfaced with power electronic converters. The number of power electronic converters to be used will rapidly increase. The unit capacity of power electronic converters will rapidly increase as well. These presents great challenges to the thermal management of a large amount of waste heat, the manufacturing of a large number of converters, the transportation and installation of heavy and bulky converters, and the operation of such large power electronic systems.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

This invention discloses a holistic rackless modular power electronic system framework that enables the massive manufacturing of modular power electronic converters that can be transported in modules and mounted together on-site easily with screws, nuts and bolts into rackless thermal-efficient modular power electronic systems.

BRIEF DESCRIPTION OF THE DRAWINGS

The accompanying figures further illustrate the disclosed embodiments and, together with the detailed description of the disclosed embodiments, serve to explain the principles of the present invention.

DETAILED DESCRIPTION

Figure 1:
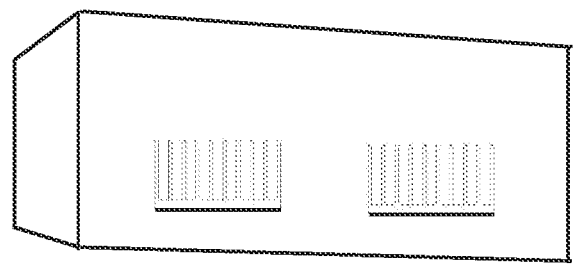
FIG. 1 illustrates a conventional power electronic converter that has heat sinks inside the case of the converter.

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein-rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a." "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms such as "and," "or," or "and/or" as used herein may include a variety of meanings that may depend at least in part upon the context in which such terms are used. Typically, "or" if used to associate a list, such as A. B, or C, is intended to mean A, B, and C, here used in the inclusive sense, as well as A, B. or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to covey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Because of the increasing capacity of power electronic converters, the need of dissipating waste heat caused by power losses is increasing. There have been a lot of advances in designing different thermal management schemes. However, the industry has mainly adopted the schemes to process the waste heat locally and inside each power electronic converter. FIG. 1 illustrates such a thermal management scheme. Heat sinks are mounted on power electronic semiconductor devices, which are all housed inside the case of the converter, often with fans used to force the air flow for better heat dissipation. The presence of an air duct inside the case means it is difficult to meet the often stringent requirements on the ingress protection (IP) against intrusion, dust, accidental contact, and water. Moreover, the use of rotating devices such as fans inside a converter is often a contributing factor to low reliability, in addition to weight and size. Cooling methods involving other fluid have also been widely introduced. However, because the dimension of a power electronic converter is often constrained and the air flow is also constrained inside the case, the performance of heat dissipation is often a limiting factor for the design of power electronic converters. As a result, there have been attempts to use natural convection for heat dissipation but, as is well known, the efficiency of natural convection is significantly lower than the efficiency of forced air convection. There is a fundamental trade-off between natural convection and forced convection.

Figure 2:
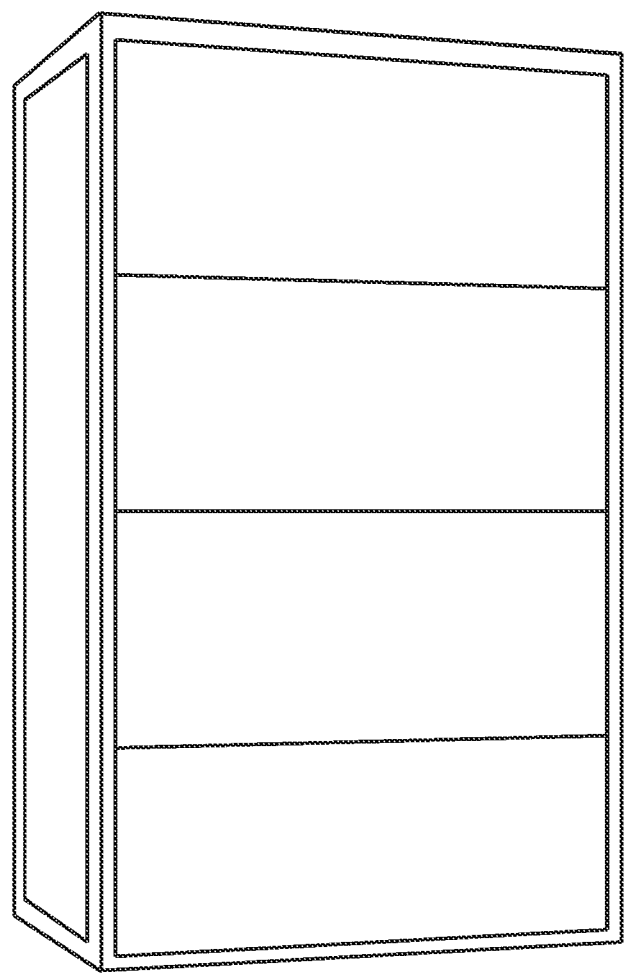
FIG. 2 illustrates a conventional modular power electronic converter with four modules installed in a rack.

Another fundamental challenge is on the manufacturability of power electronic converters with high unit capacity. The industry has adopted a modular design with a rack housing several modules with forced air convection. For example, FIG. 2 illustrates a conventional modular power electronic converter with four modules installed in a rack. While the racked design offers many benefits, the heavy weight and bulky size often become a problem during manufacturing, transportation, and installation. For example, a commercially available 400 kW 6-modular transformerless PV central inverter weighs 880 kg with the dimension of 2184 mm×1250 mm×850 mm. Of course, the increased capacity of power electronic converters means increased demand on heat dissipation because the higher the unit capacity the more waste heat. For example, the commercially available inverter mentioned above requires 5600 $m^3$ forced air flow per hour.

The disclosed invention introduces a novel concept to holistically combine the advantages of natural convection, such as reduced weight and size and enhanced reliability and ingress protection, with the advantages of forced air convection, such as higher thermal efficiency. One of the key ideas of this invention is to use natural convection at the modular converter level and forced air convection at the system level. Another key idea is to manufacture modular converters in such a way that they can be mounted easily on site to form systems without using racks and adopt forced air conduction. Hence, the unit to be handled during the whole manufacturing, transportation and installation process is only modules rather than systems.

Figure 3:
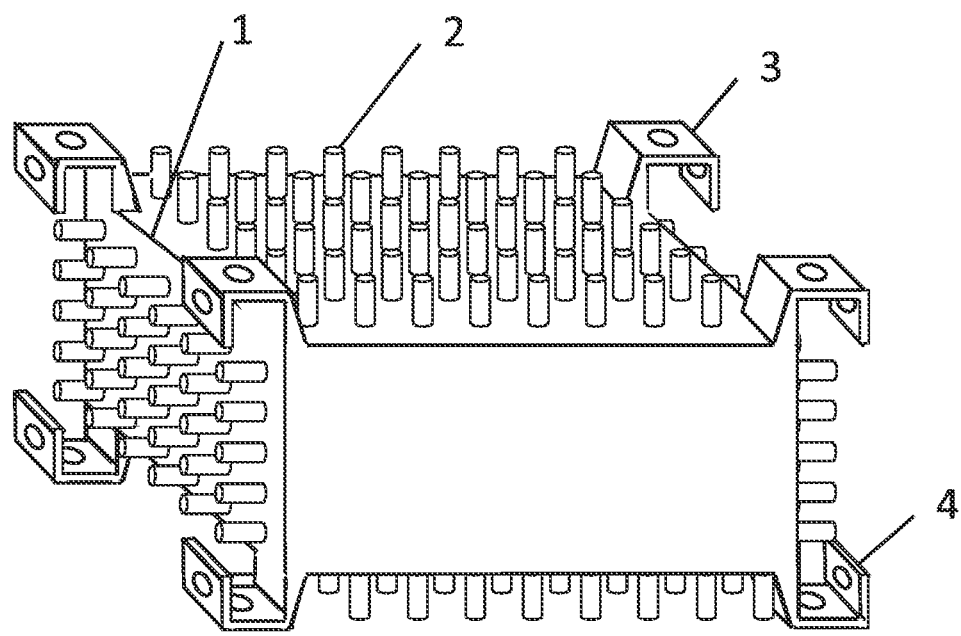
FIG. 3 illustrates the structure of the disclosed modular power electronic converter.

For the disclosed modular converters, heat-generating devices, such as power electronic semiconductors and inductors, are directly attached to the case of the power electronic converter so that the waste heat can be dissipated to the environment directly through natural convection. In this way, there is no need to use a fan inside the case, which removes a major contributing factor to reliability, weight and size. There is no need to leave an air duct inside the case either so the case can be made smaller and sealed to meet stringent IP requirements. FIG. 3 illustrates the conceptual structure design of such a modular power electronic converter. The case 1 consists of a top piece and a bottom piece, which can be fixed together and sealed, for example, with a sealing ring. Some. or all, sides of the exterior surface of the case 1 are made with heat-dissipating fins 2 to dissipate the heat from heat-generating devices, such as power electronic semiconductors and inductors, attached to the interior surface of the case 1. While it is easy to attach heat-generating devices to some sides of the interior surface of the case, it is necessary to open some holes on printed circuit boards to which the heat-generating devices are connected so that these heat-generating devices can be mounted and dismounted. Moreover, the area of the interior surface of the case 1 without heat-generating devices attached can be processed. e.g., painted with insulating paint, to reduce inward heat radiation. The size, gap and height of the fins 2 can be different for different applications. The fins 2 shown in FIG. 3 are round (pin) fins but the fins 2 can be designed to have different shapes, such as rectangular fins, square fins, elliptical fins, hexagon fins and other shapes of fins, for improved thermal efficiency and reduced weight. The fins 2 can be grouped into clusters with gaps between one cluster and another to improve thermal efficiency and reduce weight. The exterior surface of the case 1, including the fins 2, can be processed, e.g., anodized, to enhance the capability of heat dissipation.

Another important feature of the modular converter shown in FIG. 3 is that the case contains a top set of handles 3 and a bottom set of handles 4. These handles can significantly facilitate the handling of converters during manufacturing, transportation, and installation. Each handle is built with a vertical and a horizontal mounting mechanisms, such as holes, bolts, nuts and screws. The top set of vertical mounting mechanisms on the top set of handles 3 are vertically aligned with the corresponding vertical mounting mechanisms on the bottom set of handles 4 while the horizontal mounting mechanisms on one side of the case are horizontally aligned with the corresponding horizontal mounting mechanisms on the opposite side.

Figure 4:
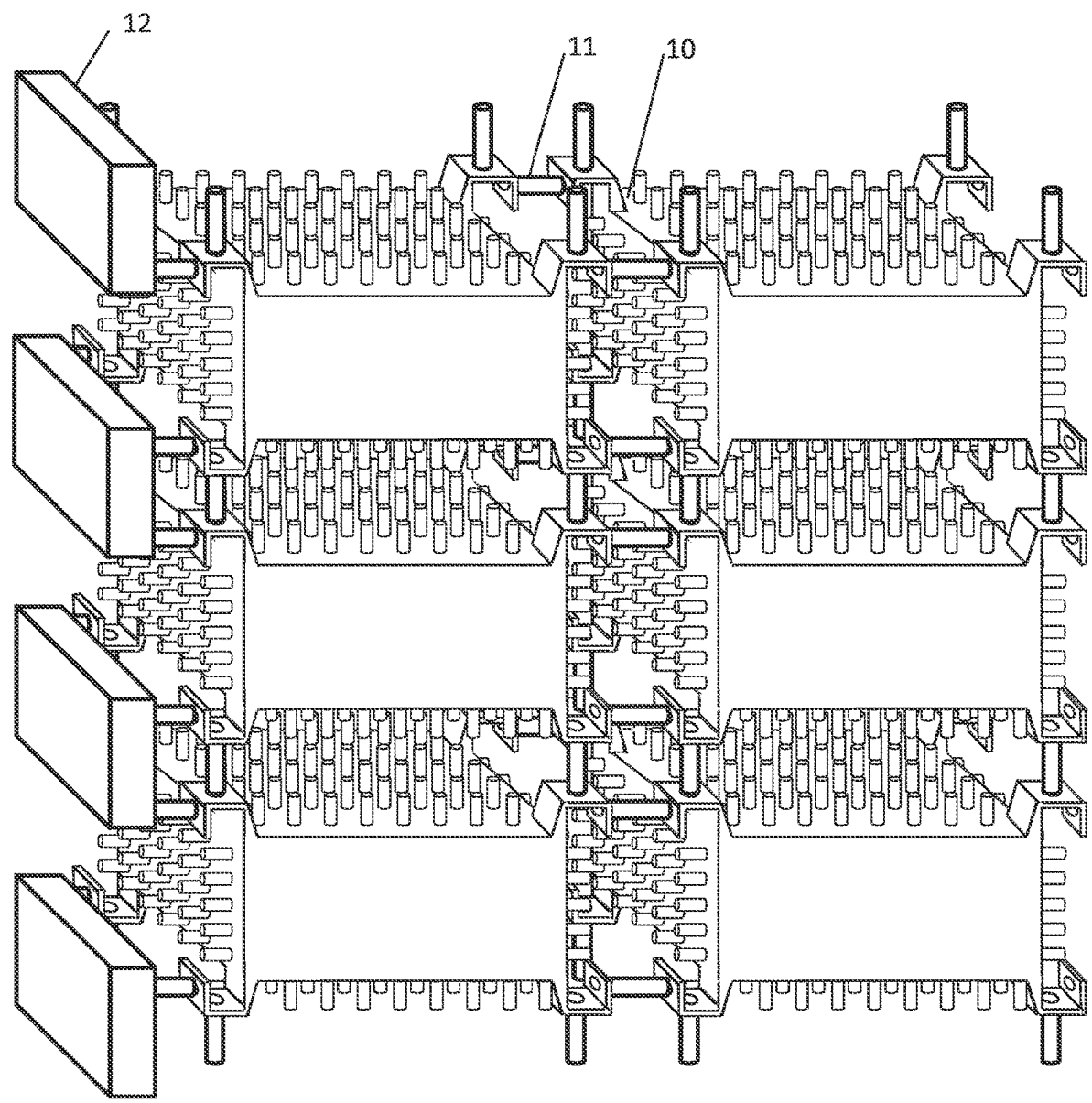
FIG. 4 illustrates the structure of the disclosed rackless thermal-efficient modular power electronic system.

Such power electronic converters can be massively manufactured as modules. Moreover, as shown in FIG. 4, one or more of such modules 10 can be easily mounted with a plural of mounting units 11, such as screws, nuts and bolts, to form a rackless modular power electronic system by mounting one module on top of another and/or one module next to another. As a result, there is no need to have a rack to hold the modules as the modules can hold each other. Removing racks that are often needed for power electronic converters is a major innovation. This significantly reduces the materials and parts needed, the unit cost, and the system weight/size to be shipped, which contributes to sustainability, reduces shipping cost, and improves handleability. Moreover, one or more electric fans 12 can be mounted on a side of the system. e.g. as illustrated in FIG. 4, or between modules. Hence, forced air convection can be achieved at the system level with high efficiency for heat dissipation. Because of the open structure, the heat dissipation is more efficient. Moreover, more powerful, more efficient, and more reliable electric fans can be adopted because of the relaxed constraint on the space. These modules can be massively manufactured and easily transported to customer sites because of the modularity. The installation only requires the modules 10 and standard components, such as screws, nuts, bolts and electric fans. Hence, the disclosed rackless thermal-efficient modular power electronic system can be easily installed on site. This holistically optimizes the efficiency and convenience of power electronic systems for the whole process from massive manufacturing, transportation, and installation to operation.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art, which are also intended to be encompassed by the following claims.

What is claimed is:

1. A power electronic converter, comprising:
   a case with heat-dissipating fins on its exterior surface; and
   a plural of heat-generating devices, such as power semiconductor devices and inductors, attached to an interior surface of the case;
   wherein the case consists of a top piece and a bottom piece fixed together and sealed with a sealing ring;
   wherein the case contains a top set of handles with vertical and horizontal mounting mechanisms and a bottom set of handles with vertical and horizontal mounting mechanisms;
   wherein the vertical mounting mechanisms of the top set of handles and the corresponding vertical mounting mechanisms of the bottom set of handles are aligned vertically; and
   wherein the horizontal mounting mechanisms on the handles are aligned horizontally with the corresponding horizontal mounting mechanisms on the opposite side.

2. The converter as claimed in claim 1, wherein the heat-dissipating fins are grouped into clusters with gaps between one cluster and another.

3. The converter as claimed in claim 1, wherein the interior surface of the case without heat-generating devices attached is painted with insulating paint to reduce inward heat radiation.

4. The converter as claimed in claim 1, wherein the heat-dissipating fins have a particular shape that improves heat dissipation.

5. The converter as claimed in claim 1, wherein the exterior surface of the case is processed to enhance the capability of heat dissipation.

6. The converter as claimed in claim 1, wherein the exterior surface of the case is anodized.

7. The converter as claimed in claim 1, wherein some of the heat-generating devices attached to the interior surface of the case are mounted and dismounted through holes on a printed circuit board to which the heat-generating devices are connected.

8. A rackless thermal-efficient modular power electronic system, comprising:
   modular power electronic converters with heat-dissipating fins on exterior surfaces; and
   a plural of mounting units that mount the modular power electronic converters together;
   wherein each modular power electronic converter contains a top set of handles with vertical and horizontal mounting mechanisms and a bottom set of handles with vertical and horizontal mounting mechanisms;
   wherein the vertical mounting mechanisms of the top set of handles and the corresponding vertical mounting mechanisms of the bottom set of handles are aligned vertically; and
   wherein the horizontal mounting mechanisms on the handles are aligned horizontally with the corresponding horizontal mounting mechanisms on the opposite side.

9. The system as claimed in claim 8, further comprising one or more electric fans mounted to the system.

10. The system as claimed in claim 8, wherein the mounting units are nuts and bolts.

11. The system as claimed in claim 8, wherein the mounting units are screws.

12. A method comprises the steps of:
   manufacturing modular power electronic converters with heat-dissipating fins on exterior surfaces and with a top set of handles with vertical and horizontal mounting mechanisms and a bottom set of handles with vertical and horizontal mounting mechanisms;
   transporting a power electronic system by the modular power electronic converters; and
   mounting one or more modular power electronic converters one-on-top-of-another and/or one-next-to-another, together with one or more electrical fans, by using a plural of mounting units;
   wherein the vertical mounting mechanisms of the top set of handles and the corresponding vertical mounting mechanisms of the bottom set of handles are made to align vertically; and
   wherein the horizontal mounting mechanisms on the handles are made to align horizontally with the corresponding horizontal mounting mechanisms on the opposite side.

* * * * *